(12) United States Patent
Akatsuka et al.

(10) Patent No.: US 6,875,643 B2
(45) Date of Patent: Apr. 5, 2005

(54) SOI SUBSTRATE AND MANUFACTURING METHOD THEREOF

(75) Inventors: Masanori Akatsuka, Tokyo (JP); Naoshi Adachi, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/740,566

(22) Filed: Dec. 22, 2003

(65) Prior Publication Data

US 2004/0232490 A1 Nov. 25, 2004

(30) Foreign Application Priority Data

Dec. 24, 2002 (JP) ........................................ 2002-372898

(51) Int. Cl.[7] .......................... H01L 21/00; H01L 21/84
(52) U.S. Cl. .................... 438/149; 438/479; 438/517
(58) Field of Search ................................ 438/149, 479, 438/517; 257/347

(56) References Cited

FOREIGN PATENT DOCUMENTS

JP    5-82525 A    4/1993

OTHER PUBLICATIONS

Hannon, Robert et al., "0.25 μm Merged Bulk DRAM and SOI Logic using Patterned SOI", 2000 Symposium on VLSI Technology Digest of Technical Papers, pp. 66–67.

*Primary Examiner*—Thien F Tran
(74) *Attorney, Agent, or Firm*—Kubovcik & Kubovcik

(57) ABSTRACT

An SOI substrate having a partial SOI structure in which a buried insulating film having a predetermined area is formed via an active layer in a part of a silicon single crystal substrate in plan view by ion-implanting elements to the part of the substrate and then applying thereto a thermal processing, wherein a thickness of a peripheral edge portion of said buried insulating film is getting thinner toward a terminal edge of said buried insulating film.

22 Claims, 7 Drawing Sheets

Fig.1(a) Silicon single crystal substrate
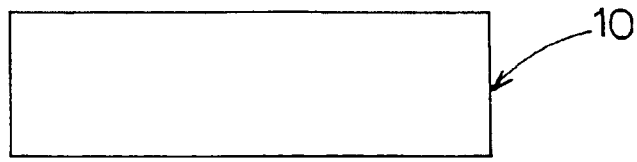
Fig.1(b) Mask formation
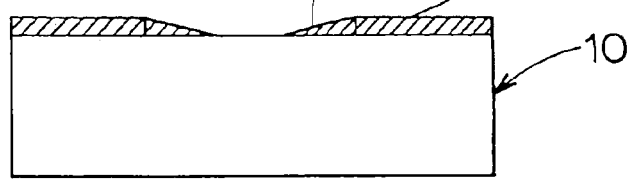
Fig.1(c) Oxygen ion-implantation
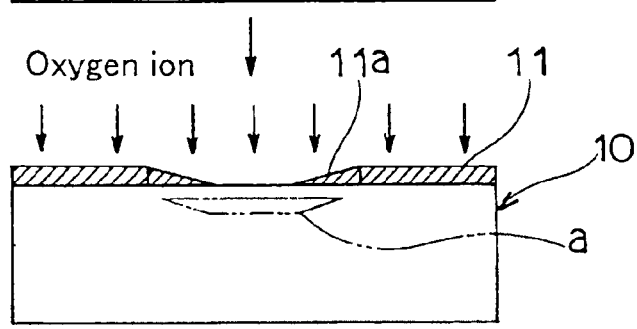
Fig.1(d) Mask removal, High temperature annealing
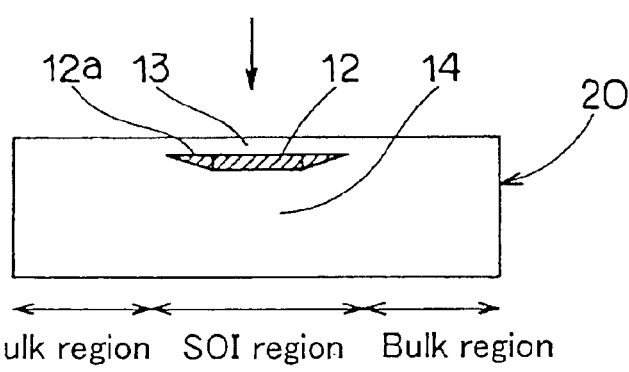
Bulk region  SOI region  Bulk region

[Fig. 2]
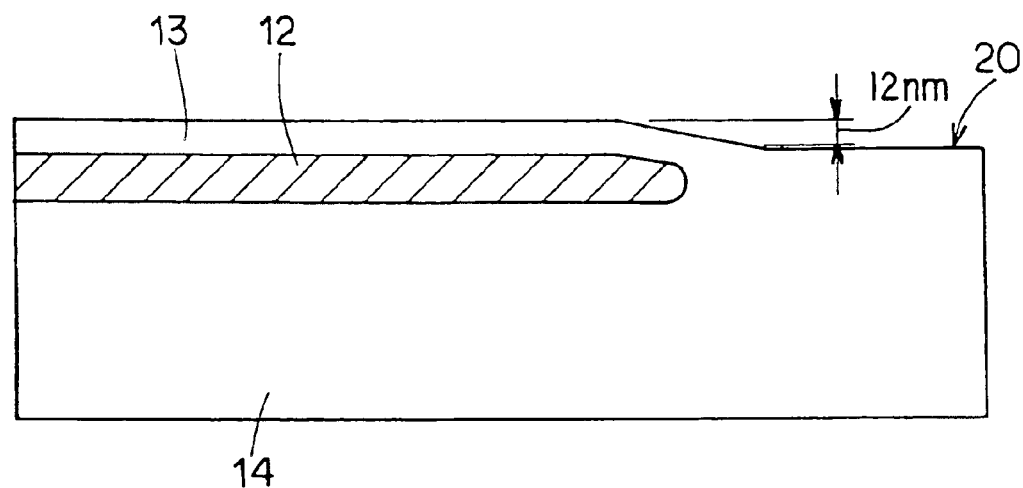
[Fig. 3]
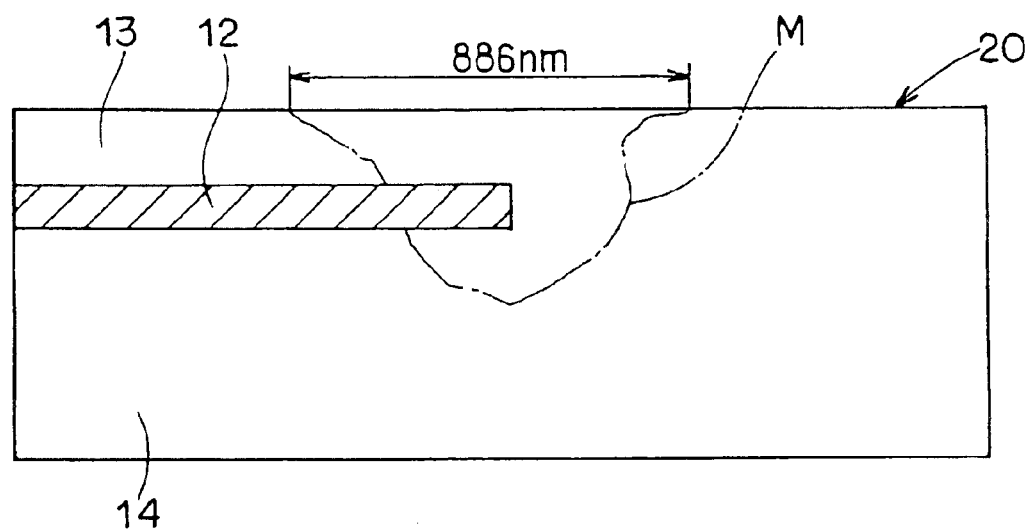

[Fig. 4]
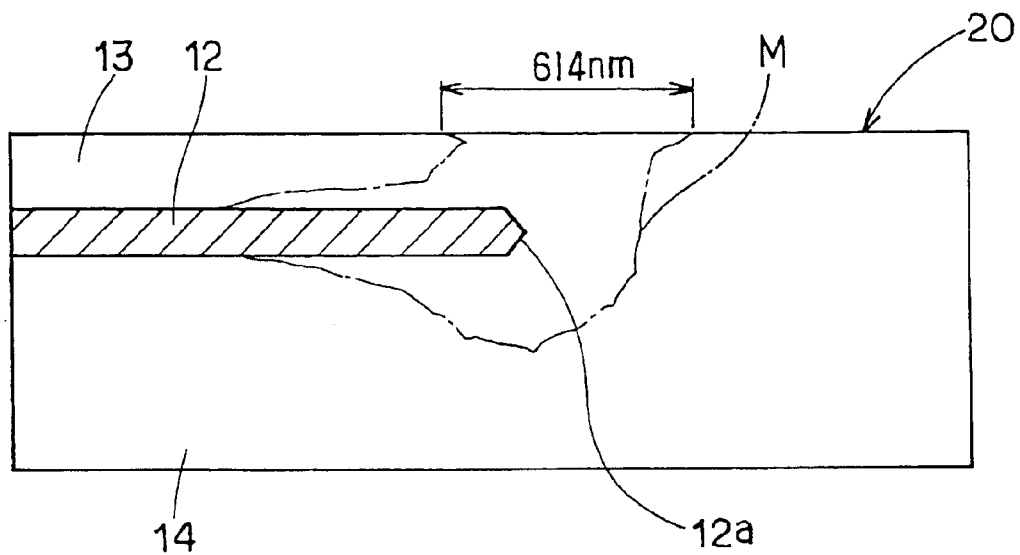
[Fig. 5]
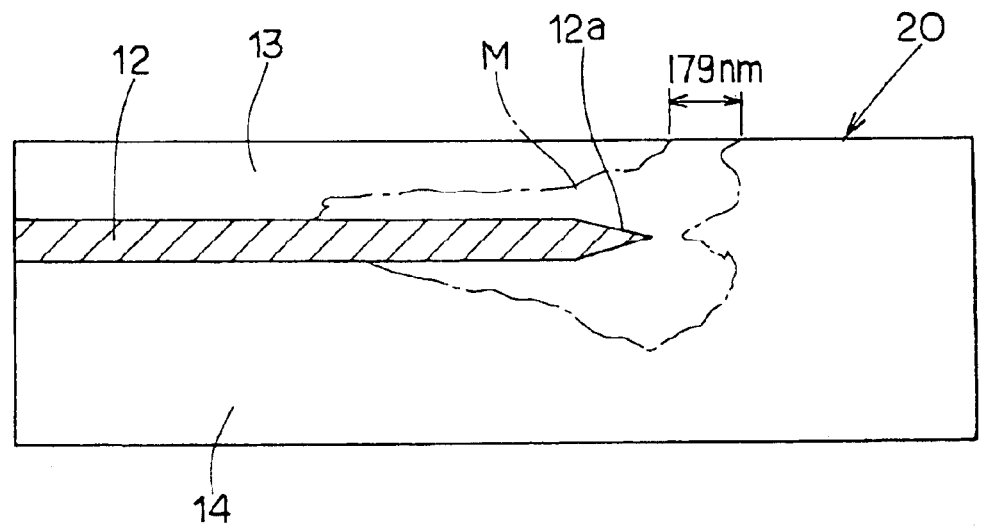

[Fig. 6]
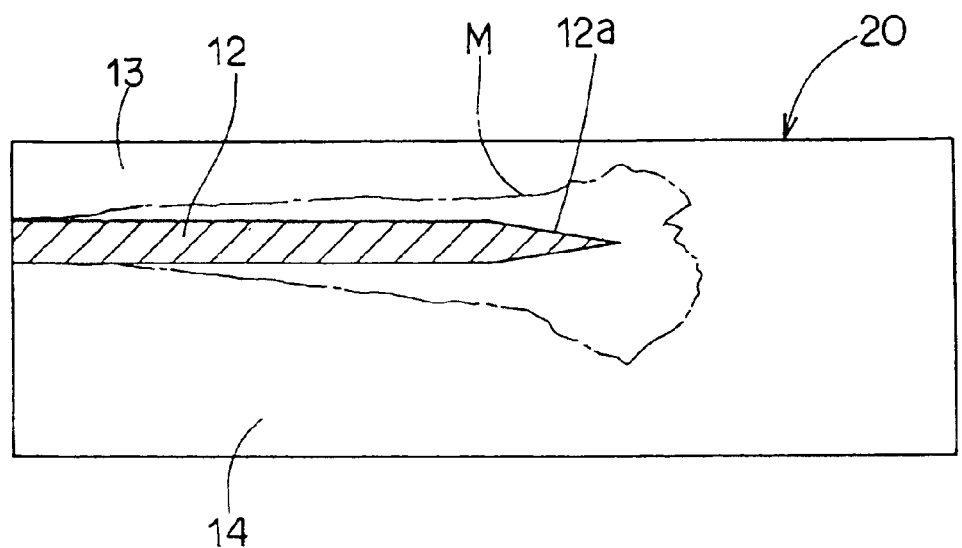
[Fig. 7]
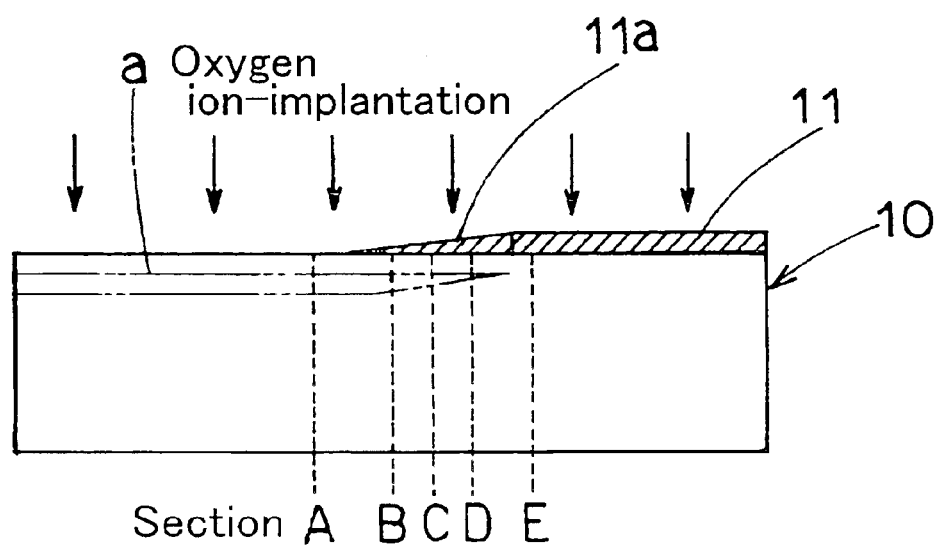

[Fig. 8]
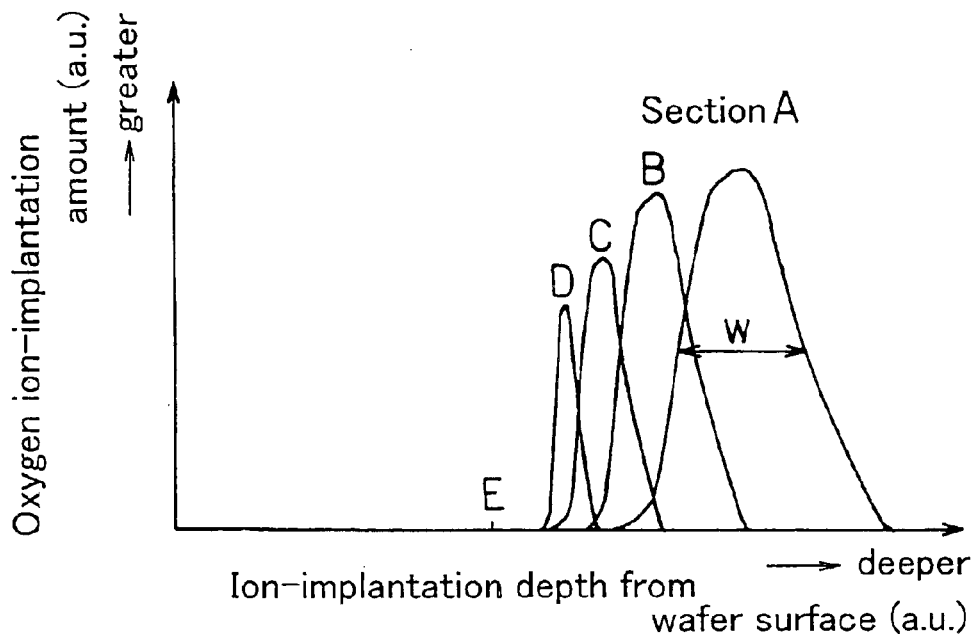
[Fig. 9]
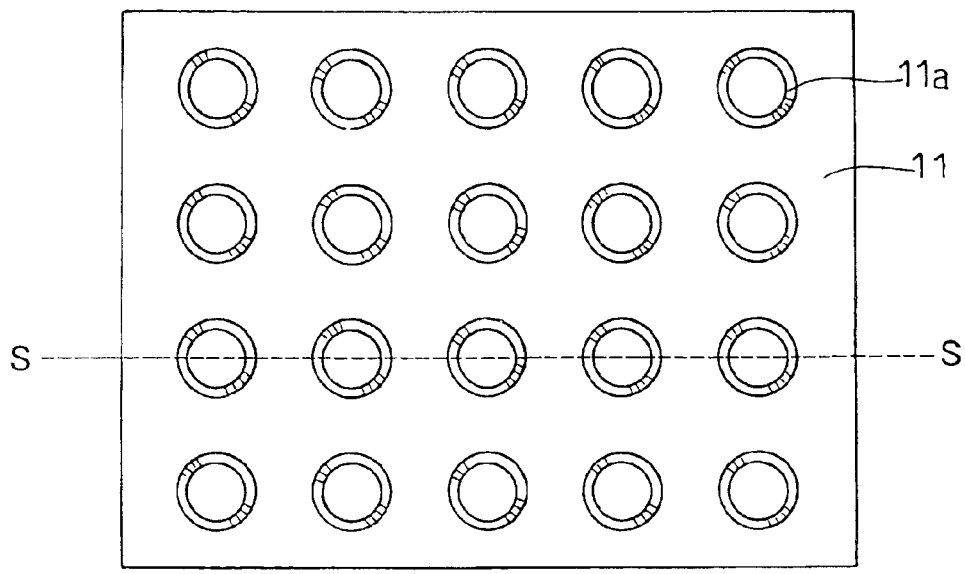

[Fig. 10]
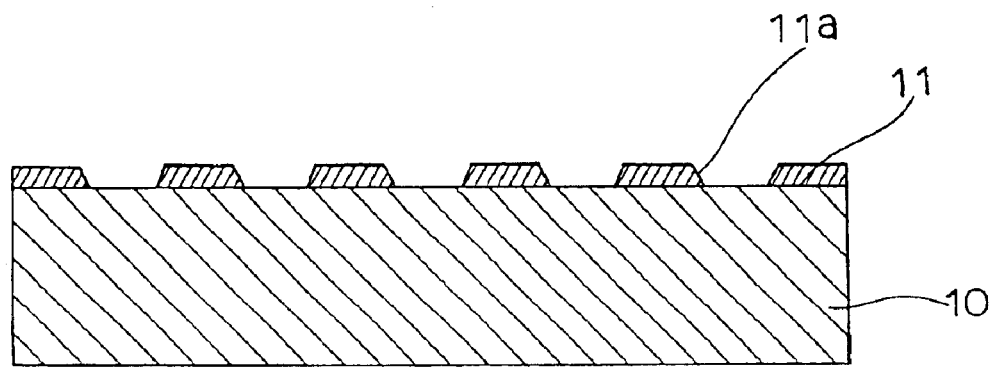
[Fig. 11]
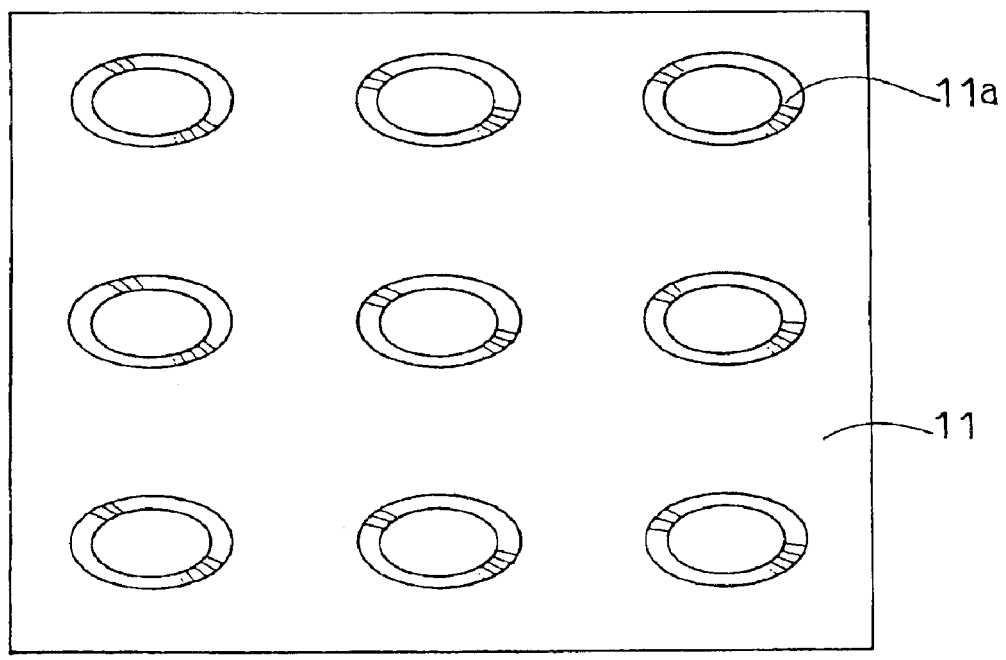

[Fig. 12]
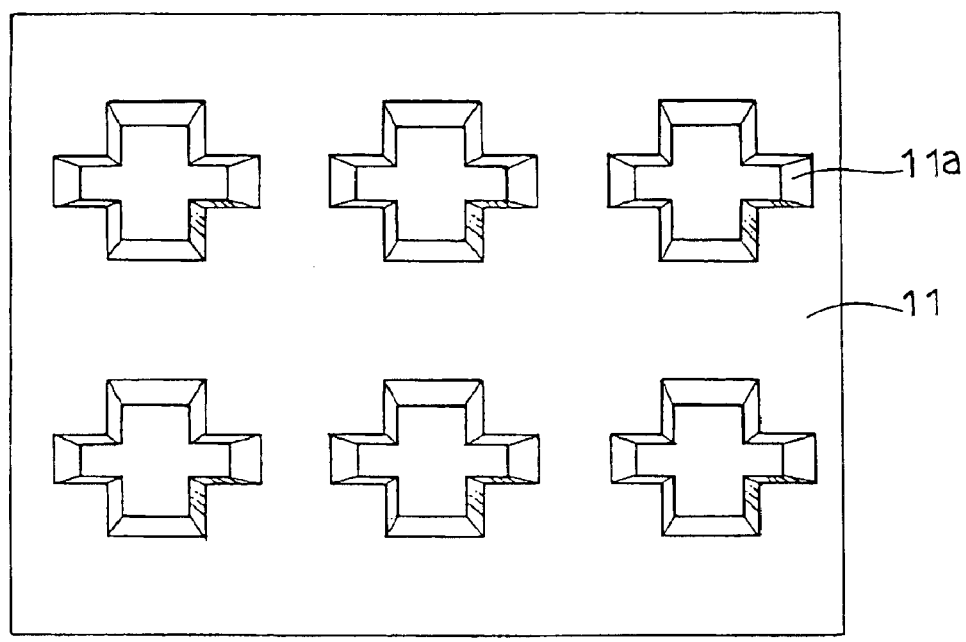

SOI SUBSTRATE AND MANUFACTURING METHOD THEREOF

BACKGROUND OF THE INVENTION

1. Field of the Invention

The present invention generally relates to an SOI (Silicon On Insulator) substrate and a manufacturing method thereof, and in particular, to an SOI substrate comprising a silicon substrate including in part an SOI structure in plan view, or an SOI substrate comprising a silicon substrate including in part a buried insulating film formed therein, and also to a manufacturing method thereof. Said SOI structure includes a SIMOX (Separation by IMplanted OXygen) structure.

2. Description of the Related Art

Aiming for a reduction in a manufacturing cost of a device as well as an improvement of a working speed, the SoC (System on Chip) technology has been suggested for providing a mixed packaging of a logic circuit and a memory circuit on one chip. Preferably, this logic circuit may be fabricated on the SOI substrate in order to reduce electric power consumption and improve the working speed. Further, preferably the memory circuit may be fabricated on a bulk crystal from a viewpoint of a crystal integrity. In this connection, a partial SOI (patterned SOI) structure has been invented, which allows for a bulk region to be left in a part of the SOI substrate.

Conventionally, as an exemplary manufacturing method of the SIMOX substrate having the partial SOI structure, there has been known, for example, a technique described in the Japanese Patent Laid-open Publication 5-82525.

Said technique defines such a manufacturing method in which, first of all, a surface of a silicon single crystal substrate is partially masked with a silicon oxide film or the like. After that, similarly to the fabrication of a regular SIMOX substrate, oxygen ions are implanted into a surface of the above silicon single crystal substrate, which is then subject to a thermal processing at a high temperature. By way of this, the SIMOX substrate can be fabricated, which has a partial SOI structure with a buried silicon oxide film formed between an active layer and a bulk layer in a part of said silicon single crystal substrate, or a region thereof having no masking applied. This manufacturing method is especially advantageous in improving of an activity aiming for a high quality of the SIMOX substrate having a thin film of active layer.

In such a manufacturing method of the SIMOX substrate as stated above according to the prior art, however, the buried silicon oxide film is expanded in its volume during the high temperature thermal processing, leading to a strain/stress to be induced in an interface between the buried silicon oxide film and the bulk layer. There has been a fear, in association with this, that a dislocation could be propagated across a region defined by a distance of some μm from this interface (IBM, Hannon, et al., 2000 Symposium on VLSI Tech. Digest).

There is another fear remaining that if the pattern of the partial SOI structure became highly micro-fabricated in future, the dislocation of the pattern could affect inversely to yield of the device.

SUMMERY OF THE INVENTION

To this end, the inventors of the present invention have devoted themselves in an enthusiastic research and made the present invention based on the finding that if the thickness of a peripheral edge portion of a buried silicon oxide film formed partially in the SOI substrate is made thinner toward a terminal edge of the buried insulating film, an amount of expansion in volume of the buried silicon oxide film in the peripheral edge portion thereof during a high temperature thermal processing could be reduced decrementally or consecutively, to thereby reduce a strain/stress possibly induced in an interface between the buried silicon oxide film and a bulk layer and thus to inhibit said dislocation from being induced.

An object of the present invention is to provide an SOI substrate, in which a strain/stress possibly induced in an interface between a partially formed buried insulating film and a bulk layer can be reduced and thus the occurrence of a dislocation resultant from said strain/stress can be inhibited.

Another object of the present invention is to provide a manufacturing method of an SOI substrate that can inhibit the occurrence of dislocation of a partial SOI structure.

A first invention provides an SOI substrate having a partial SOI structure in which a buried insulating film having a predetermined area is formed via an active layer in one part of a silicon single crystal substrate in plan view, wherein a thickness of a peripheral edge portion of said buried insulating film is getting thinner toward a terminal edge of said buried insulating film.

The phrase that the thickness of the peripheral edge portion of the buried insulating film is getting thinner toward the terminal edge of the buried insulating film means, for example, a state where the peripheral edge portion of the buried insulating film exhibiting a predetermined shape in plan view is getting thinner toward the terminal end thereof in sectional view.

The number of the buried insulating film(s) to be formed in one piece of silicon single crystal substrate, or in other words, the number of formations of the partial SOI structure (s), may be one or may be more.

The location in which the partial SOI structure is formed may be a central region or a peripheral region of the silicon single crystal substrate. Further, the shape and size of the partial SOI structure may not be limited.

The thickness of the active layer containing the buried insulating film formed therein when viewed in cross section may be in a range of 0.01 to 0.3 μm, for example. Further, the thickness of the buried insulating film in the portion excluding the peripheral edge portion having the reducing thickness, or in the portion forming a constant thickness, may be in a range of 0.1 to 0.5 μm, for example. In the case where a plurality of partial SOI structures are formed in a piece of silicon single crystal substrate, each of the buried insulating films may include the peripheral edge portion having the gradually reducing thickness and the thickness of respective films may be uniform or may be different from one another. The latter case may be advantageous in the point that, for example, when the element structures are different from one another, an optimal insulating film thickness can be achieved for each of the elements.

In the peripheral edge portion of the buried insulating film having the reduced thickness, the thickness thereof may be reduced in steps or consecutively. Reducing the thickness in steps means that there is a portion having the constant thickness in the middle of the portion having reduced thickness. Reducing the thickness consecutively means that, for example, the thickness thereof is reduced along a linear diagonal line or along a curved diagonal line in a cross section parallel to the direction of thickness of the buried insulating film.

The size (area) of the buried insulating film may not be limited. In the case where a plurality of partial SOI structures have been formed in one piece of silicon single crystal substrate, the buried insulating films may have the same size or different sizes, respectively.

A second invention provides an SOI substrate in accordance with the first invention, in which a shape of said buried insulating film is circular, elliptic or polygonal shape in plan view.

The shape of the buried insulating film, in plan view of the SOI substrate with its surface (main surface) facing up may be, for example, circular, elliptic or polygonal (e.g., at least triangular or rectangular) shape. In the case where a plurality of partial SOI structures have been formed in one piece of silicon single crystal substrate, the buried insulating films may have the same shape or different shapes, respectively.

A third invention provides an SOI substrate in accordance with the first invention, in which a width of said peripheral edge portion having reduced thickness of said buried insulating film is in a range of 10 nm to 1000 nm.

The width of the peripheral edge portion having reduced thickness is defined, in case of a circular buried oxide film having been formed in plan view for example, by a length of the peripheral edge portion of said circular insulating film measured in the radial direction from its outer edge (across a thinned film section). This thinned film section is defined such that, in plan view of the SOI substrate with its surface facing up, the insulating film in the circular shape, for example, is thinning toward its outer terminal edge. Specifically, it means that in the peripheral edge portion having reduced thickness of the buried insulating film, the thickness is decreasing gradually in a direction orthogonal to a tangential line in contact with a base end of said peripheral edge portion having reduced thickness.

In the case where a plurality of partial SOI structures have been formed in one piece of silicon single crystal substrate, the peripheral edge portions having reduced thickness of respective buried insulating films may have the same width or different widths, respectively.

Preferably, the width of the peripheral edge portion having reduced thickness of the buried insulating film may be in a range of 20 nm to 500 nm. The width of the peripheral edge portion not greater than 10 nm would not bring about any effect for inhibiting the dislocation from being induced. Further, although the width over 1000 nm would hardly induce the dislocation, the region of the peripheral edge portion having reduced thickness of the buried insulating film would reach the device forming region, which could occasionally deteriorate a reliability of the device.

The buried insulating film may include silicon oxides, for example, a silicon dioxide or a silicon monoxide.

A fourth invention provides an SOI substrate in accordance with the third invention, in which a shape of said buried insulating film is circular, elliptic or polygonal shape in plan view.

A fifth invention provides a manufacturing method of an SOI substrate having a partial SOI structure, in which a buried insulating film having a predetermined area is formed via an active layer in a part of a silicon single crystal substrate in plan view by ion-implanting elements to the part of the silicon single crystal substrate in plan view and then applying thereto a thermal processing, wherein a thickness of a peripheral edge portion of said buried insulating film is getting thinner toward a terminal edge of said buried insulating film, said method characterized in comprising: a masking film preparation step for preparing such a masking film that has an opening and is configured such that a thickness of said masking film in an edge portion defining and surrounding said opening is getting thinner toward the opening; a masking step for providing said masking film over a surface of said silicon single crystal substrate; an ion implantation step, subsequent to said masking step, for ion-implanting said elements from above the surface of said silicon single crystal substrate through said masking film to cause said elements to be bonded with the silicon in a predetermined depth; and a thermal processing step, subsequent to said ion implantation step, for applying the thermal processing to said silicon single crystal substrate to thereby form the buried insulating film in a location of a predetermined depth in said silicon single crystal substrate.

According to this manufacturing method of the SOI substrate, the elements are ion-implanted from above the surface of the silicon single crystal substrate through the opening of the masking film. At that time, the thickness of the masking film in its edge portion surrounding the opening is getting thinner toward the terminal end of the edge portion surrounding the opening. Owing to this, the amount of the ion implantation of the elements in the peripheral edge portion of said ion-implanted zone is getting lesser toward the terminal edge thereof.

During the subsequent thermal processing, the fusion or bonding of the ion-implanted elements with the silicon is accelerated. Thus, the buried insulating film is formed partially in the silicon single crystal substrate. Therefore, within the silicon single crystal substrate, such a partial SOI structure consisting of the active layer, the buried insulating film and the bulk layer can be fabricated. During the formation of the buried insulating film in this thermal processing, the buried insulating film will be expanded in volume and induce the strain/stress in the interface between the buried silicon oxide film and the bulk layer. However, the amount of ion-implantation of the elements in the peripheral edge portion of the ion-implanted zone is getting lesser toward the terminal edge thereof. As a result, the induced strain/stress is relaxed in the peripheral edge portion having reduced thickness of the buried insulating film. Consequently, the strain/stress taking effect in the interface between the buried silicon oxide film and the bulk layer is reduced, thereby inhibiting the dislocation from being induced.

During the ion-implantation, the oxygen ions may be accelerated to 30 keV to 200 keV for example. The density of the ion-implantation may fall in a range of $10^{18}$ atoms/$cm^2$.

The temperature of the thermal processing may be equal to or higher than 1100° C., preferably in a range of 1200° C. to 1400° C. With the aid of this thermal processing at the high temperature, the implanted substances, such as oxygen, can be reacted sufficiently with the silicon to form a buried insulating film, such as a silicon oxide film.

The material of the masking film may not be limited to specific ones. For example, it may include silicon oxides, silicon nitrides, photo resist, metallic thin films and the like.

The silicon oxide may include, for example, a silicon dioxide and a silicon monoxide.

The silicon nitride may include, for example, a 4-nitride-3-silicon.

The photo resist may include, for example, a novolac resin.

The metallic thin film may include, for example, a tungsten silicide film.

The size and shape of the opening formed in the masking film may be modified appropriately in association with the size and shape of the insulating film to be buried.

In the edge portion of the masking film surrounding the opening, or the region having reduced thickness, in one example, the thickness thereof may be reduced along a linear diagonal line or along a curved diagonal line in a cross section parallel to the direction of thickness of the buried insulating film. Further, there may be a portion having the constant thickness in the middle of the portion having reducing thickness.

The method for reducing the thickness of the edge portion of the masking film surrounding the opening may not be limited to specific ones. For example, the wet etching using an etchant suitable for the material of the masking film may be employed.

A sixth invention provides a manufacturing method of an SOI substrate in accordance with the fifth invention, in which said elements are oxygen.

A seventh invention provides a manufacturing method of an SOI substrate in accordance with the sixth invention, in which the thickness of the masking film in said edge portion surrounding said opening is decreased linearly toward said opening.

An eighth invention provides a manufacturing method of an SOI substrate in accordance with the sixth invention, in which a shape of said buried insulating film is circular, elliptic or polygonal shape in plan view.

A ninth invention provides a manufacturing method of an SOI substrate in accordance with the sixth invention, in which a temperature of said thermal processing is in a range of 1200° C. to 1400° C.

A tenth invention provides a manufacturing method of an SOI substrate in accordance with the sixth invention, in which a width of the masking film in said edge portion surrounding said opening is in a range of 10 nm to 1000 nm.

An eleventh invention provides a manufacturing method of an SOI substrate in accordance with the sixth invention, in which in said masking film preparation step, said opening is formed by applying a wet etching to said masking film.

A twelfth invention provides a manufacturing method of an SOI substrate in accordance with the fifth invention, in which the thickness of the masking film in said edge portion surrounding said opening is decreased linearly toward said opening.

A thirteenth invention provides a manufacturing method of an SOI substrate in accordance with the twelfth invention, in which a shape of said buried insulating film is circular, elliptic or polygonal shape in plan view.

A fourteenth invention provides a manufacturing method of an SOI substrate in accordance with the twelfth invention, in which a temperature of said thermal processing is in a range of 1200° C. to 1400° C.

A fifteenth invention provides a manufacturing method of an SOI substrate in accordance with the twelfth invention, in which a width of the masking film in said edge portion surrounding said opening is in a range of 10 nm to 1000 nm.

A sixteenth invention provides a manufacturing method of an SOI substrate in accordance with the twelfth invention, in which in said masking film preparation step, said opening is formed by applying a wet etching to said masking film.

A seventeenth invention provides a manufacturing method of an SOI substrate in accordance with the fifth invention, in which a shape of said buried insulating film is circular, elliptic or polygonal shape in plan view.

The polygonal shape may include, for example, triangular or rectangular shape.

An eighteenth invention provides a manufacturing method of an SOI substrate in accordance with the seventeenth invention, in which a temperature of said thermal processing is in a range of 1200° C. to 1400° C.

A nineteenth invention provides a manufacturing method of an SOI substrate in accordance with the seventeenth invention, in which a width of the masking film in said edge portion surrounding said opening is in a range of 10 nm to 1000 nm.

A twentieth invention provides a manufacturing method of an SOI substrate in accordance with the seventeenth invention, in which in said masking film preparation step, said opening is formed by applying a wet etching to said masking film.

A twenty-first invention provides a manufacturing method of an SOI substrate in accordance with the fifth invention, in which a temperature of said thermal processing is in a range of 1200° C. to 1400° C.

A twenty-second invention provides a manufacturing method of an SOI substrate in accordance with the twenty-first invention, in which a width of the masking film in said edge portion surrounding said opening is in a range of 10 nm to 1000 nm.

A twenty-third invention provides a manufacturing method of an SOI substrate in accordance with the twenty-first invention, in which in said masking film preparation step, said opening is formed by applying a wet etching to said masking film.

A preferred temperature of the thermal processing is in a range of 1250 to 1350° C. With the temperature lower than 1200° C., the buried insulating film of high quality could not be obtained. The temperature higher than 1400° C. may cause a slip, one of crystal defects, more frequently.

A twenty-fourth invention provides a manufacturing method of an SOI substrate in accordance with the fifth invention, in which a width of the masking film in said edge portion surrounding said opening is in a range of 10 nm to 1000 nm.

A twenty-fifth invention provides a manufacturing method of an SOI substrate in accordance with the twenty-fourth invention, in which in said masking film preparation step, said opening is formed by applying a wet etching to said masking film.

A preferred width of the masking film in the edge portion surrounding the opening is in a range of 20 nm to 500 nm. The width less than 10 nm would not allow the formation of the insulating film having a width sufficient for inhibiting the dislocation. Further, with the width greater than 1000 nm, the film-thickness-reduced region of the insulating film could occasionally reach the device forming region, which could deteriorate a reliability of the device.

The twenty-sixth invention provides a manufacturing method of an SOI substrate in accordance with the fifth invention, in which in said masking film preparation step, said opening is formed by applying a wet etching to said masking film.

In the SOI substrate according to the present invention, since the thickness of the peripheral edge portion of the buried insulating film formed partially (in one part of its plane in plan view) in the interior of the silicon single crystal substrate has been made thinner toward the terminal edge of said buried insulating film, therefore the expansion in volume of the buried insulating film in said thinned film section during the thermal processing at high temperature can be reduced. This can help reduce the strain/stress in said thinned film section, which might be induced in the interface between the buried insulating film and the bulk layer, thus inhibiting the occurrence of the dislocation.

BRIEF DESCRIPTION OF THE DRAWINGS

FIGS. 1(a)–(d) is a flow sheet showing a manufacturing method of a SIMOX substrate (SOI substrate) according to one embodiment of the present invention;

FIG. 2 is an enlarged sectional view of a main part of a SIMOX substrate, for illustrating a level difference in the surface of the SIMOX substrate having a buried silicon oxide film whose peripheral edge portion has not been thinned;

FIG. 3 is an enlarged sectional view of a main part of the SIMOX substrate, for illustrating a strain/stress distribution within the SIMOX substrate having the level difference of FIG. 2;

FIG. 4 is an enlarged sectional view of a main part of a SIMOX substrate, for illustrating a strain/stress distribution in the SIMOX substrate having a buried silicon oxide film whose peripheral edge portion defined by a distance of 50 nm from the terminal edge thereof has been thinned;

FIG. 5 is an enlarged sectional view of a main part of a SIMOX substrate, for illustrating a strain/stress distribution in the SIMOX substrate having a buried silicon oxide film whose peripheral edge portion defined by a distance of 180 nm from the terminal edge thereof has been thinned;

FIG. 6 is an enlarged sectional view of a main part of a SIMOX substrate, for illustrating a strain/stress distribution in the SIMOX substrate having a buried silicon oxide film whose peripheral edge portion defined by a distance of 300 nm from the terminal edge thereof has been thinned;

FIG. 7 is an enlarged sectional view of a main part of a SIMOX substrate, for illustrating a profile of the oxygen ion-implantation when the oxygen ions are implanted by using a masking film whose thickness has been varied;

FIG. 8 is a graphical representation indicating results of the SIMS (secondary ion mass spectroscopy) measurements in a profile of the oxygen ion-implantation when the oxygen ions are implanted by using a masking film whose thickness has been varied;

FIG. 9 is a plan view showing a silicon single crystal substrate with a masking film including a plurality of circular openings in a lattice design deposited on the surface thereof;

FIG. 10 is a sectional view taken along the line S—S of FIG. 9;

FIG. 11 is a plan view of a masking film for the case where the shape of the buried insulating film is elliptic shape; and FIG. 12 is a plan view showing a masking film in an example, in which the shape of the buried insulating film is polygonal shape.

DETAILED DESCRIPTION OF THE INVENTION

An SOI substrate according to the present invention and a manufacturing method thereof will now be described.

The present embodiment uses a SIMOX substrate as the SOI substrate. The SOI substrate includes the SIMOX substrate, a bonding substrate and the likes.

First of all, a single crystal silicon ingot is pulled up by the well-known CZ (Czochralski) method. After that, thus obtained single crystal ingot is processed with block cutting, slicing, beveling, lapping, etching and surface mirror polishing, in this sequence, to thereby prepare a silicon single crystal substrate 10 having a thickness of 725 μm and a diameter of 200 mm with one of the surfaces having been mirror polished (FIG. 1(a)).

Subsequently, the surface of this silicon single crystal substrate 10 is covered with a masking film 11. Specifically, the silicon single crystal substrate 10 is introduced into a thermal oxidation furnace to experience an oxidative thermal processing under an oxidizing gas atmosphere at 100° C. for 100 minutes. Through this process, the masking film 11 composed of a 0.08 μm thick silicon oxide is formed on an exposed surface of the silicon single crystal substrate 10 (FIG. 1(b)). The thickness of this masking film 11 has been determined to be 0.08 μm, the value greater than the thickness of 0.05 μm, which is considered sufficient to provide a blocking effect of the masking film 11 against oxygen, with the depth of implantation of the oxygen by the ion-implantation taken into account.

Subsequently, a photo resist film, which is not shown but has a large number of circular openings arranged in a lattice design in plan view, is coated on a top of the masking film 11 in the well-known lithography technique. Each region on the silicon single crystal substrate 10 corresponding to each of those openings defines a region in which a buried silicon oxide film (buried insulating film) 12 is to be formed later.

After that, this silicon single crystal substrate 10 is dipped in a solution containing 10 wt % of hydrofluoric acid at 25° C. for two minutes, so that a large number of circular openings are formed in the lattice design in the masking film 11. FIG. 9 and FIG. 10 show this condition. The thickness of the masking film in each edge portion 11a surrounding the opening is getting thinner gradually (continuously) toward the opening. For each circular opening, the width of the edge portion 11a surrounding the opening of the masking film 11, where the thickness thereof is getting thinner, is 300 nm in a radial direction of the opening. Further, the thickness of the edge portion 11a surrounding the opening is varying linearly (thinning at a certain ratio) in a cross section parallel to the direction of thickness of the masking film 11. It is to be noted that the thickness and material of said masking film 11 or the composition and concentration of said etchant (HF solution) can be modified to thereby set any desired value for the width of the edge portion 11a surrounding the opening.

After that, this photo resist film is removed by using a predetermined resist stripper.

Subsequently, by using a medium current ion implanter with an accelerating voltage of 100 keV, oxygen ions are implanted at $10^{18}$ atoms/cm² into the interior of said silicon single crystal substrate 10 through respective openings of the masking film 11 (FIG. 1(c)). The depth of the implantation of oxygen ion is about 0.5 μm.

Through this process, a large number of circular ion-implanted regions "a", each having a predetermined area and spaced by a predetermined interval from each other (in the lattice design), is formed within the silicon single crystal substrate 10. Specifically, there are a large number of circular ion-implanted regions forming the lattice design and not ion-implanted regions in the silicon single crystal substrate 10 in plan view. Before the process of the ion-implantation, the thickness of the masking film 11 in its edge portion 11a surrounding the opening has been formed to get thinner toward the terminal edge thereof. Due to this, the amount of implantation of the oxygen in the peripheral edge portion of the ion-implanted region "a" within the silicon single crystal substrate 10 is decreased gradually toward the outer edge of the ion-implanted region "a".

Next, thus obtained silicon single crystal substrate 10 is introduced into a thermal processing furnace, that has been held to be 700° C. in advance, and then the temperature is increased up to 1320° C. to apply a high temperature annealing to the substrate 10 for ten hours (FIG. 1(d)). This accelerates the fusion and bonding of the ion-implanted oxygen with the silicon leading to the precipitation of oxide (SiOx). Specifically, a large number of buried silicon oxide films, each having the thickness in the order of 0.3 μm, are formed in each ion-implanted region "a". Furthermore, the thickness of each buried silicon oxide film 12 in its peripheral edge portion 12a is getting gradually thinner toward the terminal edge of each buried silicon oxide film 12. This is because the amount of the ion-implantation of oxygen in the peripheral edge portion of each ion implanted region "a" is decreasing toward the outer edge of the circular ion-implanted region "a".

As a result, a partial SOI structure arranged in the lattice design in plan view is formed in the silicon single crystal substrate 10. The area of the partial SOI structure is made up of three-layer structure consisting of an active layer 13, the buried silicon oxide film 12 and a bulk layer 14.

It is to be noted that during said high temperature annealing process, the strain/stress may be induced in the interface between each buried silicon oxide film 12 and the bulk layer 14 caused by an expansion in volume of the buried silicon oxide film 12, or a difference in the amount of expansion in volume between the silicon and the silicon oxide, within the silicon single crystal substrate 10. However, since the thickness of each buried silicon oxide film 12 in its peripheral edge portion 12a is getting gradually thinner toward the terminal end of the buried silicon oxide film 12 as described above, the strain/stress can be relaxed in the peripheral edge portion 12a of each buried silicon oxide film 12. Owing to this, the occurrence of the dislocation resultant from the strain/stress can be inhibited.

Thus fabricated silicon single crystal substrate 10 having the partial SOI structure may be used, for example, in the following manner in the subsequent device process. Specifically, in the active layer (SOI region) 13 in the region where each buried silicon oxide film has been formed in the silicon single crystal substrate 10, a logic circuit including the CMOS, for example, may be formed. In the active layer (bulk region) 13 of the silicon single crystal substrate 10 between any adjacent SOI regions, a memory circuit such as the DRAM may be formed (again FIG. 1(d)), respectively.

In FIG. 1 through FIG. 6, reference numeral 20 designates the fabricated SIMOX substrate.

In this connection, with reference to FIG. 2 through FIG. 6, the effectiveness on the reduction in the strain/stress according to the illustrated embodiment was examined by executing a simulation by a calculator and an actual test.

First of all, the stress in the interface between the buried silicon oxide film and the bulk layer in a conventional SIMOX substrate was calculated. For the formation of the buried silicon oxide film, typically the high temperature annealing process in a range of 1200° C. to 1400° C. is applied. The buried silicon oxide film is expanded in its volume by heat during the high temperature annealing process, so that a level difference may be developed in the surface of the SIMOX substrate 20 in the interface region between the buried silicon oxide film 12 and the bulk layer 14, as shown in FIG. 2. FIG. 3 shows a calculation result of the strain/stress distribution for the case of, for example, 12 nm level difference that has been developed in this interface region. In the surface of the SIMOX substrate 20, the width in the radial direction of the region "M" in which the Mises stress fell in a range of $4.9 \times 10^2$ MPa to $6.5 \times 10^2$ MPa was 886 nm in the vicinity of the interface region.

Next, in one example of the present invention, the calculation was executed to determine the strain/stress for the case where the thickness of the buried silicon oxide film 12 is reduced in its region defined by a distance of about 50 nm from the terminal edge thereof (peripheral edge portion 12a). Similarly, in the surface of the SIMOX substrate 20, the measured widthin the radial direction of the interface region "M" in which the Mises stress fell in the range of $4.9 \times 10^2$ MPa to $6.5 \times 10^2$ MPa was 614 nm (FIG. 4). It has been found from the result that the region having the higher stress is narrowed as compared to the case of the buried silicon oxide film 12 shown in FIG. 3. It is considered that the region of critical stress inducing the dislocation is also similarly narrowed.

Similarly, for each of the case where the region having reduced thickness (peripheral edge portion 12a) is defined by the distance of 180 nm (FIG. 5) or 300 nm (FIG. 6) from the terminal edge of the buried silicon oxide film 12, the width of the radial direction of the interface region "M" in which the Mises stress fell in the range of $4.9 \times 10^2$ MPa to $6.5 \times 10^2$ MPa was measured. The result showed the width of the interface region "M" was 179 nm for the case where the region having reduced thickness (peripheral edge portion 12a) is defined by the distance of 180 nm. On the other hand, for 300 nm, the stress was relaxed in the interior of the SIMOX substrate 20, and the interface region "M" did not emerge on the substrate surface.

Then the test for examining the effectiveness of the present invention on the reduction in strain/stress will now be described.

First of all, the masking film 11 was formed on the surface of the silicon single crystal substrate 10, to which the oxygen ion-implantation and the high temperature thermal processing were applied. The results are shown in Table 1.

TABLE 1

|  | Width of thinning region (width of peripheral edge region 12a) (nm) | Dislocation propagating distance (μm) |
|---|---|---|
| Test Example 1 | 1000 | 0 |
| Test Example 2 | about 500 | 0 |
| Test Example 3 | about 300 | about 1.0 |
| Test Example 4 | about 200 | about 1.5 |
| Test Example 5 | about 80 | about 3.0 |
| Test Example 6 | about 10 | about 7.5 |
| Comparative Example 1 | 0 | about 7.5 |

It has been confirmed from Table 1 that as the width of the peripheral edge portion 12a of the buried silicon oxide film 12 is getting increased, the distance of propagation of the dislocation developed from the interface between the buried silicon oxide film 12 and the bulk layer 14 is getting shorter. It has been further confirmed that, for the case of the smaller width (shorter than 10 nm) of the peripheral edge portion 12a in the buried silicon oxide film 12, no inhibiting effect on the dislocation takes place. It has been also confirmed that in contrast to this, for the width of the thinning peripheral edge portion 12a over 1000 nm, almost no dislocation is induced.

Subsequently, with reference to FIG. 7 and FIG. 8, it has been confirmed by using the secondary ion mass spectroscopy (SIMS) whether or not the manufacturing method of the SIMOX substrate of the present invention has achieved a desired oxygen ion-implantation profile, or a desired distribution having a narrowed width of the ion-implanted region "a" of the oxygen which is to be formed into the buried silicon oxide film 12 through the high temperature thermal processing.

A graphical representation of FIG. 8 indicates a shape of the masking film 11 shown in FIG. 7 and a concentration profile of the oxygen obtained when the ion-implantation is applied to the silicon single crystal substrate 10 by using said masking film 11. Sections A to E of the graphical representation of FIG. 8 correspond to the section A to E of FIG. 7. It can be seen that as the thickness of the masking film 11 increases, the implantation width "w" of the implanted oxygen ions is reduced.

Further, the silicon single crystal substrate 10 was subjected to the high temperature thermal processing and then the thickness of the obtained buried silicon oxide film 12 was measured by a transmission electron microscope. It has been confirmed from the result that in the peripheral edge portion of the buried silicon oxide film 12, the buried silicon oxide film 12 is getting thinner in association with the variation of the implantation width of the oxygen ions.

The above facts show that by employing the masking system of the present invention to form the partial SOI structure having a shape of the buried silicon oxide film whose peripheral edge portion has been tapered and thinned, a partial SOI wafer of high quality with no dislocation otherwise induced from the strain/stress in the interface region between the buried silicon oxide film and the bulk layer could be obtained.

It is to be noted that FIG. 11 shows the masking film 11 used in the case where the shape of the buried insulating film is elliptical not perfect circular. For this case also, as similarly to the above embodiment, the HF solution has been used and the peripheral edge portion 11a surrounding the opening has been formed such that the thickness thereof is getting thinner gradually.

FIG. 12 shows the masking film 11 in the example in which the buried insulating film is polygonal (cross-shape).

In either one of the examples, the structure allowing for the thickness of the peripheral edge portion of the buried insulating film to get thinned gradually can be fabricated by executing the ion-implantation by using said masking film.

What is claimed is:

1. A manufacturing method of an SOI substrate having a partial SOI structure, in which a buried insulating film having a predetermined area is formed via an active layer in a part of a silicon single crystal substrate in plan view by ion-implanting elements to the part of the silicon single crystal substrate in plan view and then applying thereto a thermal processing, wherein a thickness of a peripheral edge portion of said buried insulating film is getting thinner toward a terminal edge of said buried insulating film, said method characterized in comprising:
   a masking film preparation step for preparing such a masking film that has an opening and is configured such that a thickness of said masking film in an edge portion defining and surrounding said opening is getting thinner toward the opening;
   a masking step for providing said masking film over a surface of said silicon single crystal substrate;
   an ion implantation step, subsequent to said masking step, for ion-implanting said elements from above the surface of said silicon single crystal substrate through said masking film to cause said elements to be bonded with the silicon in a predetermined depth; and
   a thermal processing step, subsequent to said ion implantation step, for applying the thermal processing to said silicon single crystal substrate to thereby form the buried insulating film in a location of a predetermined depth in said silicon single crystal substrate.

2. A manufacturing method of an SOI substrate in accordance with claim 1, in which in said masking film preparation step, said opening is formed by applying a wet etching to said masking film.

3. A manufacturing method of an SOI substrate in accordance with claim 1, in which a width of the masking film in said edge portion surrounding said opening is in a range of 10 nm to 1000 nm.

4. A manufacturing method of an SOI substrate in accordance with claim 3, in which in said masking film preparation step, said opening is formed by applying a wet etching to said masking film.

5. A manufacturing method of an SOI substrate in accordance with claim 1, in which a temperature of said thermal processing is in a range of 1200° C. to 1400° C.

6. A manufacturing method of an SOI substrate in accordance with claim 5, in which a width of the masking film in said edge portion surrounding said opening is in a range of 10 nm to 1000 nm.

7. A manufacturing method of an SOI substrate in accordance with claim 5, in which in said masking film preparation step, said opening is formed by applying a wet etching to said masking film.

8. A manufacturing method of an SOI substrate in accordance with claim 1, in which a shape of said buried insulating film is circular, elliptic or polygonal shape in plan view.

9. A manufacturing method of an SOI substrate in accordance with claim 8, in which a temperature of said thermal processing is in a range of 1200° C. to 1400° C.

10. A manufacturing method of an SOI substrate in accordance with claim 8, in which a width of the masking film in said edge portion surrounding said opening is in a range of 10 nm to 1000 nm.

11. A manufacturing method of an SOI substrate in accordance with claim 8, in which in said masking film preparation step, said opening is formed by applying a wet etching to said masking film.

12. A manufacturing method of an SOI substrate in accordance with claim 1, in which the thickness of the masking film in said edge portion surrounding said opening is decreased linearly toward said opening.

13. A manufacturing method of an SOI substrate in accordance with claim 12, in which a shape of said buried insulating film is circular, elliptic or polygonal shape in plan view.

14. A manufacturing method of an SOI substrate in accordance with claim 12, in which a temperature of said thermal processing is in a range of 1200° C. to 1400° C.

15. A manufacturing method of an SOI substrate in accordance with claim 12, in which a width of the masking film in said edge portion surrounding said opening is in a range of 10 nm to 1000 nm.

16. A manufacturing method of an SOI substrate in accordance with claim 12, in which in said masking film preparation step, said opening is formed by applying a wet etching to said masking film.

17. A manufacturing method of an SOI substrate in accordance with claim 1, in which said elements are oxygen.

18. A manufacturing method of an SOI substrate in accordance with claim 17, in which the thickness of the masking film in said edge portion surrounding said opening is decreased linearly toward said opening.

19. A manufacturing method of an SOI substrate in accordance with claim 17, in which a shape of said buried insulating film is circular, elliptic or polygonal shape in plan view.

20. A manufacturing method of an SOI substrate in accordance with claim 17, in which a temperature of said thermal processing is in a range of 1200° C. to 1400° C.

21. A manufacturing method of an SOI substrate in accordance with claim 17, in which a width of the masking film in said edge portion surrounding said opening is in a range of 10 nm to 1000 nm.

22. A manufacturing method of an SOI substrate in accordance with claim 17, in which in said masking film preparation step, said opening is formed by applying a wet etching to said masking film.

* * * * *